United States Patent
Brew et al.

(10) Patent No.: US 11,615,842 B2
(45) Date of Patent: Mar. 28, 2023

(54) MIXED CONDUCTING VOLATILE MEMORY ELEMENT FOR ACCELERATED WRITING OF NONVOLATILE MEMRISTIVE DEVICE

(71) Applicant: INTERNATIONAL BUSINESS MACHINES CORPORATION, Armonk, NY (US)

(72) Inventors: Kevin W. Brew, Niskayuna, NY (US); Wei Wang, Yorktown Heights, NY (US); Injo Ok, Loudonville, NY (US); Lan Yu, Voorheesville, NY (US); Youngseok Kim, Upper Saddle River, NJ (US)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 17/121,379

(22) Filed: Dec. 14, 2020

(65) Prior Publication Data

US 2022/0189550 A1 Jun. 16, 2022

(51) Int. Cl.
G11C 11/00 (2006.01)
G11C 13/00 (2006.01)
G11C 27/00 (2006.01)

(52) U.S. Cl.
CPC ........ G11C 13/0069 (2013.01); G11C 13/004 (2013.01); G11C 13/0004 (2013.01); G11C 13/0061 (2013.01); G11C 27/005 (2013.01)

(58) Field of Classification Search
CPC ............ G11C 13/0069; G11C 13/0004; G11C 13/004; G11C 13/0061

USPC .......................................................... 365/148
See application file for complete search history.

(56) References Cited

U.S. PATENT DOCUMENTS

| 8,471,234 | B2 | 6/2013 | Tong |
| 8,918,352 | B2 | 12/2014 | Deng |
| 10,164,179 | B2 | 12/2018 | Brew |
| 10,186,657 | B2 | 1/2019 | Brew |
| 10,229,736 | B2 | 3/2019 | Brew |
| 10,714,179 | B2 * | 7/2020 | Ge ....................... H01L 27/1085 |
| 10,896,731 | B1 * | 1/2021 | Li ......................... G11C 15/046 |

(Continued)

FOREIGN PATENT DOCUMENTS

| CN | 104461399 A | 3/2015 |
| CN | 105761750 A | 7/2016 |

(Continued)

OTHER PUBLICATIONS

Notification of Transmittal of the International Search Report and the Written Opinion of the International Searching Authority, or the Declaration, dated Feb. 16, 2022, International application No. PCT/CN2021/129585, 10 pages.

(Continued)

*Primary Examiner* — Vu A Le
(74) *Attorney, Agent, or Firm* — L. Jeffrey Kelly

(57) ABSTRACT

An embodiment in the application may include an analog memory structure, and methods of writing to such a structure, including a volatile memory element in series with a non-volatile memory element. The analog memory structure may change resistance upon application of a voltage. This may enable accelerated writing of the analog memory structure.

25 Claims, 5 Drawing Sheets

(56) References Cited

U.S. PATENT DOCUMENTS

| | | | |
|---|---|---|---|
| 2008/0078985 A1* | 4/2008 | Meyer | H01L 45/147 |
| | | | 257/E47.002 |
| 2009/0225584 A1 | 9/2009 | Rao | |
| 2016/0056211 A1* | 2/2016 | Cho | G06F 12/0868 |
| | | | 257/4 |
| 2016/0267976 A1 | 9/2016 | Cho | |
| 2017/0364306 A1* | 12/2017 | Kim | G06F 3/0602 |
| 2019/0019081 A1 | 1/2019 | Kim | |
| 2020/0335693 A1* | 10/2020 | Lee | H01L 45/1253 |
| 2022/0069206 A1* | 3/2022 | Cheng | H01L 45/08 |

FOREIGN PATENT DOCUMENTS

| | | |
|---|---|---|
| WO | 2017039608 A1 | 3/2017 |
| WO | 2022127446 A1 | 6/2022 |

OTHER PUBLICATIONS

Courbariaux, et al., "Binarized Neural Networks: Training Neural Networks with Weights and Activations Constrained to +1 or −1," CoRR, Mar. 17, 2016, 11 pages, vol. abs/1602.02830, arXiv:1602.02830v3, Retrieved from the internet: <URL: http://arxiv.org/abs/1602.02830>.

Gokmen, et al., "Acceleration of Deep Neural Network Training with Resistive Cross-Point Devices: Design Considerations," Frontiers in Neuroscience, Jul. 2016, 13 pages, vol. 10, Article 333, DOI: 10.3389/fnins.2016.00333, Retrieved from the Internet: <URL: https://www.frontiersin.org/articles/10.3389/fnins.2016.00333/full>.

Hocenski, et al., "Accelerated Gradient Learning Algorithm for Neural Network Weights Update," KES '08: Proceedings of the 12th International Conference on Knowledge-Based Intelligent Information and Engineering Systems Part I, Sep. 2008, pp. 49-56, Retrieved from the Internet: <URL: https://doi.org/10.1007/978-3-540-85563-7_12>.

Hoskins, et al., "Streaming Batch Eigenupdates for Hardware Neural Networks" Frontiers in Neuroscience, Aug. 6, 2019, 9 pages, vol. 13, Article 793, DOI: 10.3389/fnins.2019.00793, Retrieved from the Internet: <URL: https://www.frontiersin.org/articles/10.3389/fnins.2019.00793/full>.

Jo, et al., "Nanoscale Memristor Device as Synapse in Neuromorphic Systems," Nano Letters, 2010 [accessed on Mar. 3, 2020], pp. 1297-1301, vol. 10, DOI: 10.1021/nl904092h.

\* cited by examiner

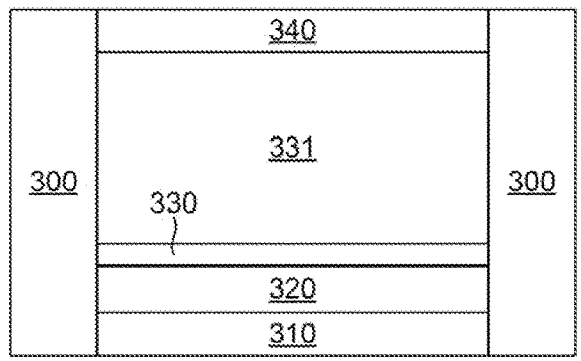
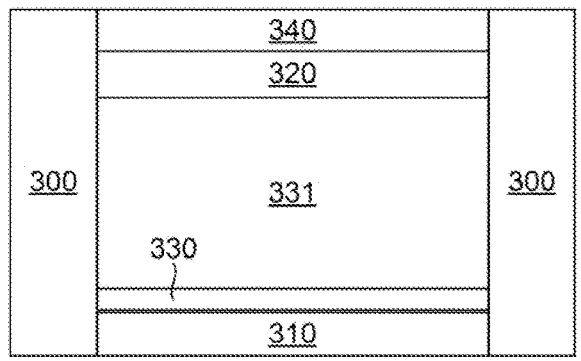
FIG. 4A    FIG. 4B
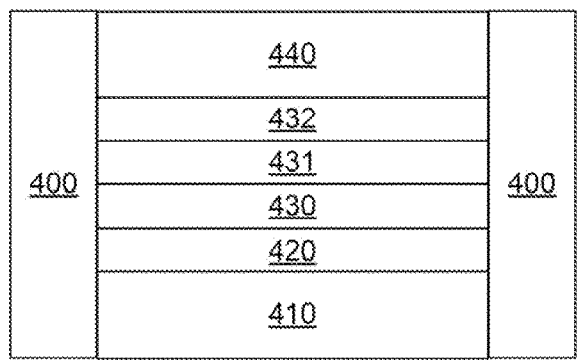
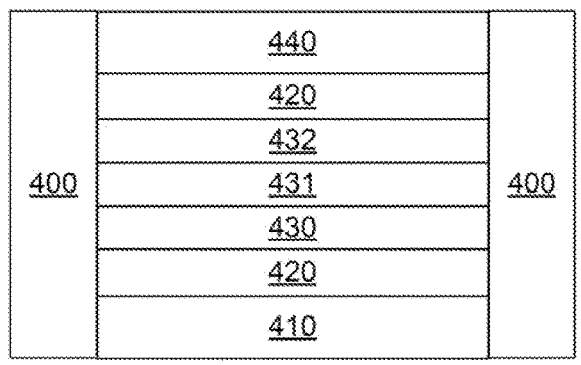
FIG. 5A    FIG. 5B

MIXED CONDUCTING VOLATILE MEMORY ELEMENT FOR ACCELERATED WRITING OF NONVOLATILE MEMRISTIVE DEVICE

BACKGROUND

The present invention relates to memory devices, and more specifically, to memristive devices.

"Machine learning" is used to broadly describe a primary function of electronic computing systems that learn from data as a form of artificial intelligence. In machine learning and cognitive science, artificial neural networks (ANNs) are a family of statistical learning models and algorithms inspired by the biological neural networks of animals, and in particular, the brain. ANNs are often comprised of analog devices that emulate artificial neurons for machine learning. In supervised machine learning, the artificial neurons of an ANN can be used to estimate or approximate systems and functions that depend on a large number of training inputs. Trained ANN's are then used in the process of inference to compute some output based on the initial or continued input training of the ANN's neurons. ANNs may also be used to self-train in the process of reinforcement machine learning or unsupervised learning. ANN architectures, neuromorphic microchips and ultra-high density non-volatile memory can be formed from high density, low cost, low power circuit architectures such as cross-bar arrays. A basic crossbar array configuration includes a set of conductive row wires and a set of conductive column wires formed to intersect the set of conductive row wires. The intersections between the two sets of wires are separated by so-called cross-point devices, which can be formed from thin film materials. Cross-point devices can be implemented as so-called resistive memory (colloquially, memristive) devices. Characteristics of a memristive device may include non-volatility, the ability to store a variable analog resistance value, the ability to determine the analog resistance value without disturbing the state of the memristive device, and the ability to tune up or tune down a resistance using current or voltage pulses. These memristive devices can be used in hardware to simulate the artificial neurons of an ANN.

BRIEF SUMMARY

An embodiment may include a memory structure including a volatile memory element in series with a non-volatile memory element. This may enable accelerated writing of the analog memory structure.

An embodiment may include a memristive device as the non-volatile memory element. This may enable accelerated writing of the analog memory structure for use with analog computing.

An embodiment may include the volatile memory element being a material that temporarily changes its resistance when subjected to electrical potential across the material. This may enable accelerated writing of the analog memory structure.

An embodiment may include the volatile memory element being a material that becomes more conductive upon the application of an electric potential across the material and returns to a relaxed state once the electric potential is removed. This may enable accelerated writing of the analog memory structure.

An embodiment may include the volatile memory element being between a first metal layer and a second metal layer. This may improve stability of the device by reducing migration of ions from the volatile memory. This may enable accelerated writing of the analog memory structure.

An embodiment may include the volatile memory layer including a mixed ionic-electronic conducting (MIEC) material which undergoes metal-insulator transitions (MIT) dependent on local ion concentration within the volatile memory layer. This may enable accelerated writing of the analog memory structure.

An embodiment may include the volatile memory layer including a $XCoO_2$, $XNbO_2$, $XVO_2$, $XNbO_3$, $X_{4x}Ti_5O_{12}$, and/or $XSmNiO_3$, where X may be an alkali metal such as Li, Na, or K This may enable accelerated writing of the analog memory structure.

An embodiment may include the volatile memory layer being in a write path of a three terminal-device. This may enable accelerated writing of the three-contact device.

An embodiment may include a bi-directional non-volatile memory. This may enable accelerated writing of the bi-directional memory.

An embodiment may include a uni-directional non-volatile memory. This may enable accelerated writing of the uni-directional memory.

An embodiment may include a resistive random-access memory (RRAM) non-volatile memory. This may enable accelerated writing of the RRAM.

An embodiment may include a conductive bridging random-access memory (CBRAM) non-volatile memory. This may enable accelerated writing of the CBRAM.

An embodiment may include a electrochemical random-access memory (ECRAM) non-volatile memory. This may enable accelerated writing of the ECRAM.

An embodiment may include a phase change memory (PCM) non-volatile memory. This may enable accelerated writing of the PCM.

An embodiment may include writing to a memory structure including a volatile memory element in series with a non-volatile memory element. Writing to the analog memory structure may include a first pulse to the analog memory structure and a second pulse to the analog memory structure. Writing to the analog memory structure may be done such that time between the first pulse and the second pulse is less than a relaxation rate of the volatile memory element. This may enable accelerated writing of the analog memory structure.

An embodiment may include writing to a memory structure including a volatile memory element in series with a non-volatile memory element. Writing to the analog memory structure may include a first pulse to the analog memory structure, a second pulse to the analog memory structure, and a third negative pulse to the analog memory structure. Writing to the analog memory structure may be done such that time between the first pulse and the second pulse is less than a relaxation rate of the volatile memory element, and the time between the second pulse and the third negative pulse is less than a relaxation rate of the volatile memory element and more than the first time. This may enable a reset operation of the analog memory structure.

An embodiment may include writing to a memory structure including a volatile memory element in series with a non-volatile memory element. Writing to the analog memory structure may include a first pulse to the analog memory structure, a second pulse to the analog memory structure, and a third pulse to the analog memory structure. Writing to the analog memory structure may be done such that time between the first pulse and the second pulse is less than a relaxation rate of the volatile memory element, and the time between the second pulse and the third pulse is less than a relaxation rate of the volatile memory element and more than the first time. This may enable approaching an analog weight to be stored in the analog memory structure.

BRIEF DESCRIPTION OF THE DRAWINGS

FIG. 4A and FIG. 4B depict a volatile memory element in series with an RRAM device;

FIG. 5A and FIG. 5B depict a volatile memory element in series with an ECRAM device;

Figure 1A:
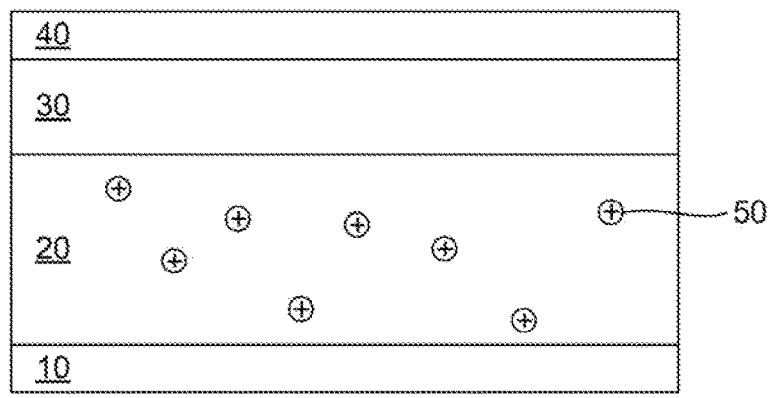
FIG. 1A-1C depict the operation of an analog memory structure comprised of a volatile memory element in series with a non-volatile memristive device.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

This invention describes a method and structure of volatile memristive device, for example a layer of mixed ionic electronic conducting (MIEC) material, that can be integrated in series with a non-volatile memristive device for neuromorphic computing with hardware enabled accelerated weight update. The volatile memory element consists of a material that undergoes a transition in conductivity (e.g. metal-insulator transition such as a Mott transition) when depleted of ions, resulting in a higher conductivity region. Subsequent polarization of ions in the MIEC layer due to an applied electric field results in increasingly higher conductivity.

When a voltage is placed across the device, ions polarize to either side due drift in the electric field). This creates a depletion of ions at one interface, and a super-saturation of ions at the opposite interface. Specific MIEC materials such as $LiCoO_{2-x}$ undergo an electrical conductivity change becoming more metallic upon depletion where the super-saturated and saturated regions remain insulating. The layer overall becomes more conductive. When no bias is applied, the ions relax to equilibrium at a rate slower than the write cycle timeframe (1 ns write, relaxation ~10-100 ns for $LiCoO_{2-x}$)

Figure 1B:
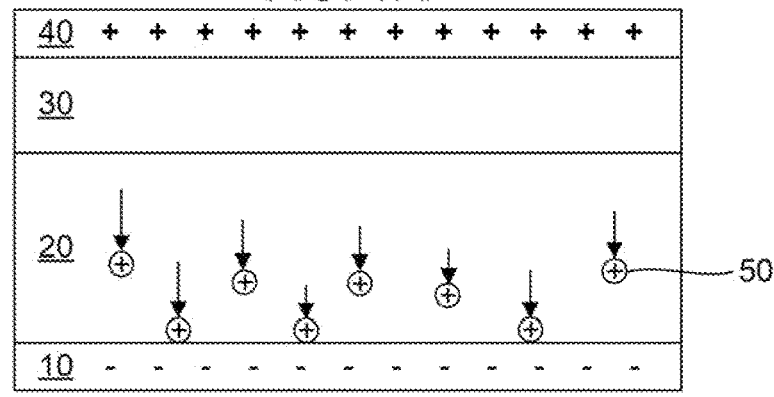
Figure 1C:
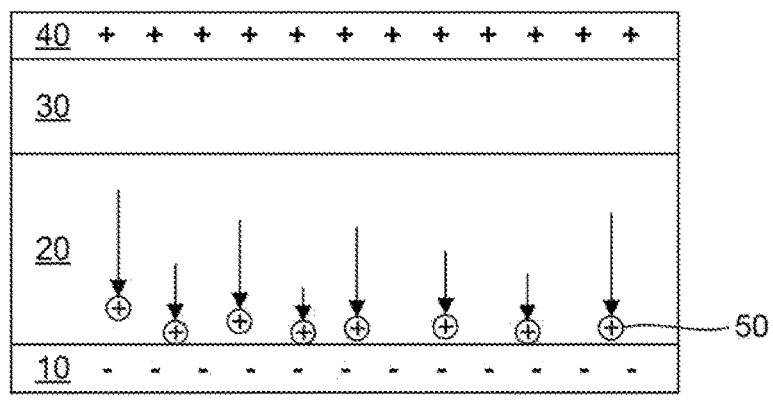

Stochastic pulses may be used to write non-volatile memristive devices (e.g. RRAM). As consecutive pulses are used, the volatile memory element polarizes, allowing more current through the non-volatile memristive device, allowing for an "accelerated write" of the non-volatile element. After writing, the ions begin to relax, reducing the conductivity of the MIEC. If the weight is over-potentiated and write pulse switches polarity before fully relaxed, the "re-write" will decelerate before accelerating in the opposite direction—working like momentum to writing the weight FIG. 1A-1C depict the operation of an analog memory structure. FIG. 1A depicts a memory structure containing first contact 10, a volatile memory element 20, a non-volatile memristive element 30, and a second contact 40. First contact 10 and second contact 40 may be any type of electrically conductive line or via with liner, and may be made of any conductive materials such as, for example, Cu, W, TiN, TaN, or Ta.

The non-volatile memristive element 30 may be a bi-directional non-volatile memristive device such as RRAM, CBRAM, ECRAM, or other similar structure. Additionally, the non-volatile memristive element 30 may be a uni-directional non-volatile memristive device, such as a PCM, or other uni-directional structures. Further, while non-volatile memristive element 30 is depicted as a two terminal device, in instances where the memristive element has additional terminals (e.g., a three-terminal device having different terminals for the read path and the write path), the MIEC material should be located in series with the flow of current of the write path of the memristive element.

Volatile memory element 20 may be any material that temporarily changes its resistance when subjected to electrical potential across the material and returns to a relaxed state of its original resistance when the potential is removed from the cell. For example, the volatile memory element may become more conductive upon the application of an electric potential across the material and returns to a relaxed state once the electric potential is removed from the cell. In an example embodiment, MIT MIEC materials may achieve an accelerative state from the movement of ions from one surface to the other when a potential is applied across the structure, thereby creating a depletion region and a saturation region in the material. As these regions form, the overall layer becomes more conductive, thereby increasing current flow across the cell during write cycles and decreasing the number of write cycles necessary to achieve the desired resistive state of the non-volatile memristive element 30.

For example, FIG. 1A depicts the analog memory structure when the volatile memory element 20 is in a relaxed state, as there is no potential across the first contact 10 and the second contact 40. A plurality of mobile ions 50 are depicted as positive charges randomly ordered about the volatile memory element 20. In FIG. 1B, following the application of a potential across the first contact 10 and the second contact 40, the mobile ions 50 migrate towards the first contact 10, thereby reducing resistance and improving conductivity across the analog memory structure. In FIG. 1C, further migration of mobile ions 50 toward the surface of first contact 10 occurs, either through a sustained potential across the first contact 10 and the second contact 40, or through additional pulses performed in succession (i.e., in less time than is required for the volatile memory element 20 to relax back to the state of FIG. 1A), further reducing the resistance as compared to FIG. 1B.

Figure 2:
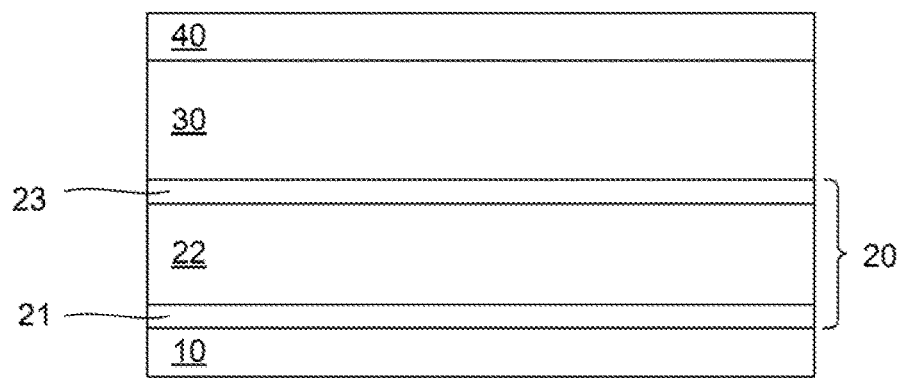
FIG. 2 depicts an example analog memory structure material stack of a volatile memory element in series with a non-volatile memristive device.

Referring to FIG. 2, an example layout of a material stack is depicted for an embodiment of the analog memory structure. The analog memory structure contains a first contact 10, a volatile memory element 20, a non-volatile memristive element 30, and a second contact 40. First contact 10 and second contact may be conductive elements connecting the analog memory structure to other functional elements of the semiconductor structure. For example, the contacts may be word lines, bit lines, vias, or any other conductive structure. The material of the first contact 10 and second contact 40 may include copper, aluminum, titanium nitride, tantalum nitride or tungsten. Volatile memory element 20 may include a first metal layer 21, a volatile memory material layer 22, and a second metal layer 23, but in at least must include a volatile memory layer 22.

Volatile memory material layer 22 may be any material that becomes more conductive upon the application of an electric potential across the material and returns to a relaxed state once the electric potential is removed from the cell. The volatile memory material layer 22 may be defined by the time it takes the material to return to a relaxed state following the removal of the electric potential. In an example embodiment, the volatile memory element 20 may return to a relaxed state in under 1000 ns, and more preferably in under 200 ns. The volatile memory material layer 22 may be a MIEC material, including an metal-insulator transitioning (MIT)MIEC material such as, for example, $XCoO_2$, $XNbO_2$, $XVO_2$, $XNbO_3$, $X_{4x}Ti_5O_{12}$, and/or $XSmNiO_3$, where X may be an alkali metal such as Li, Na, or K. The volatile memory element 20 may be about $\frac{1}{10}^{th}$ to about $\frac{1}{1000}^{th}$ the overall thickness of the non-volatile memristive element 30.

First metal layer 21 and second metal layer 23 may be used to block the ions in the volatile memory material layer 22 from migrating outside the layer. The material of the first metal layer 21 and second metal layer 23 may include metal, metal nitrides, or other conductive materials. It should be noted that while second metal layer 23 is shown separate from the non-volatile memory element 30, this layer may (or in other orientations first metal layer 21) may be metal that also functions as part of the non-volatile memory element 30. Further, first metal layer 21 and second metal layer 23 may be the same, or different materials, depending on device characteristics. In some embodiments, the second metal layer 23 may include wiring form portion of a device to another, or alternatively may be connected to device wiring, whereby the non-volatile memory element 30 and the volatile memory element 20 are not co-located within a single memory cell.

Figure 3A:
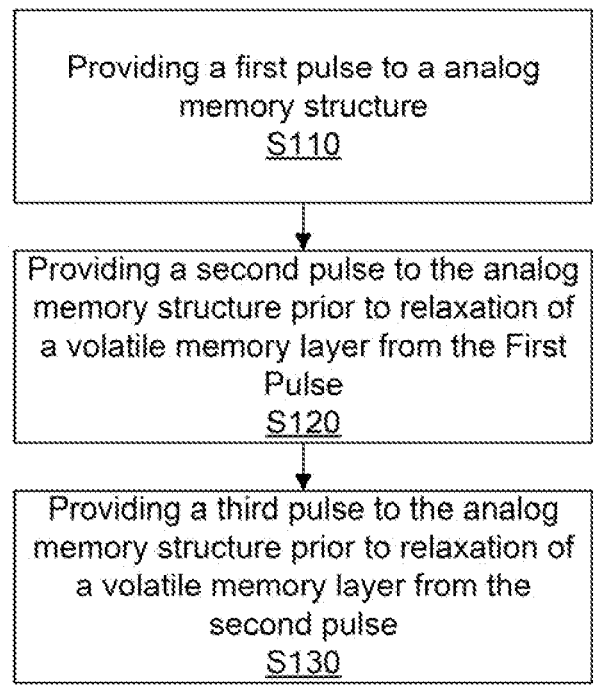
FIG. 3A, FIG. 3B, FIG. 3C, and FIG. 3D depict example methods of operation of a volatile memory element in series with a non-volatile memristive device.

Referring to FIG. 3A, a method of using the analog memory structure of FIG. 1A and FIG. 2 for accelerated writing is depicted. In step S110, a first electrical pulse is applied to the analog memory structure. The characteristics of the electrical pulse may be based on the characteristics of a write pulse for the type of non-volatile memristive element 30 used in the analog memory structure. For example, the electrical pulse may be 1 to 10 V, 1 to 50 ns for write pulses, and 0.05V to 1 V, 10 to 100 ns for read pulses, although voltage and duration may fall outside these ranges based on the type of non-volatile memristive element 30 that is selected.

In step S120, a second electrical pulse is applied to the analog memory structure before the volatile memory element 20 returns to a relaxed state. For example, the second electrical pulse may be applied less than about 10 ns following the end of the first electrical pulse and may be done using similar characteristics as the first electrical pulse. By sending the second electrical pulse in close succession (i.e., prior to relaxation of the volatile memory element 20), the non-volatile memristive element 30 may undergo an increased change in state than occurred during the first electrical pulse.

In step S130, a third electrical pulse is applied to the analog memory structure before the volatile memory element 20 returns to a relaxed state. For example, the third electrical pulse may be applied about less than about 10 ns following the end of the second electrical pulse and may be done using similar characteristics as the second electrical pulse. By sending the third electrical pulse in close succession (i.e., prior to relaxation of the volatile memory element 20), the non-volatile memristive element 30 may undergo an increased change in state compared to what occurred during the second electrical pulse.

While the method depicted in FIG. 3A only illustrates 3 electrical pulses, it should be noted that additional pulses may be applied in the manner described (i.e., prior to relaxation of the volatile memory element 20) so that each pulse has an increased ability to change the state of (i.e., write to) the non-volatile memristive element 30 than the pulse prior to the current pulse, as well as the first pulse, up until it achieves a maximum write speed when the volatile memory element is maximally potentiated. Thus, the method of FIG. 3A in conjunction with the structures of FIGS. 1 and 2A, accelerates the writing process for analog memory when the writing process is performed using write pulses performed without giving the volatile memory element 20 time to relax.

Figure 3B:
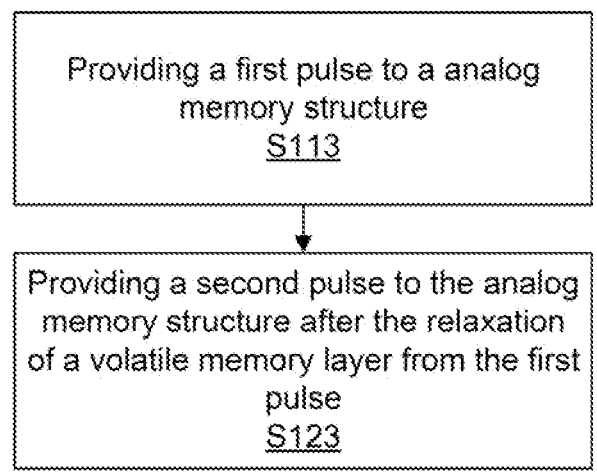

Referring to FIG. 3B, a method of using the analog memory structure of FIG. 1A and FIG. 2 for non-accelerated writing is depicted. In step S113, a first electrical pulse is applied to the analog memory structure. The characteristics of the electrical pulse may be based on the characteristics of a write pulse for the type of non-volatile memristive element 30 used in the analog memory structure. For example, 1 to 10 V, 1 to 100 ns for write pulses, and 0.05V to 1 V, 10 to 100 ns for read pulses, although voltage and duration may fall outside these ranges based on the type of non-volatile memristive element 30 that is selected.

In step S123, a second electrical pulse is applied to the analog memory structure after the volatile memory element 20 returns to a relaxed state. For example, the second electrical pulse may be applied at least about 10 ns following the end of the first electrical pulse. By sending the second electrical pulse after the volatile memory element 20 returns to a rested state, the non-volatile memristive element 30 may undergo a similar change in state that occurred during the first electrical pulse.

It should be noted that the contrast between the method of FIG. 3A and the method of FIG. 3B is that the analog memory structure achieves an accelerated writing state due to the continued pulses in close succession (i.e., prior to relaxation of the volatile memory element 20) to one another, and not from a permanent change in the structure of the volatile memory element 20.

Figure 3C:
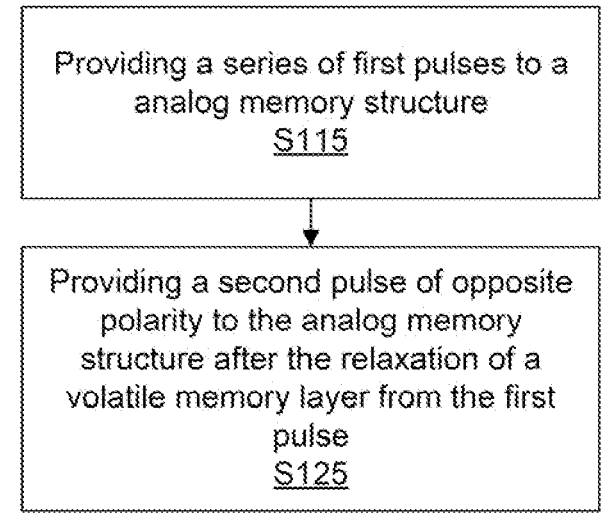

Referring to FIG. 3C, a method of using the analog memory structure of FIG. 1A and FIG. 2 for providing a negative pulse is depicted. In step S115S, a series of first electrical pulses is applied to the analog memory structure. The characteristics of the electrical pulse may be based on the characteristics of a write pulse for the type of non-volatile memristive element 30 used in the analog memory structure. For example, 1 to 10 V, 1 to 50 ns for write pulses, and 0.05V to 1 V, 10 to 100 ns for read pulses, although voltage and duration may fall outside these ranges based on the type of non-volatile memristive element 30 that is selected. The series of first electrical pulses may be performed 1 ns apart from each other.

In step S125, a second electrical pulse of an opposite polarity to the series of first electrical pulses is applied to the analog memory structure after the volatile memory element 20 returns to a relaxed state. For example, when the second electrical pulse may be applied at least 10 ns following the end of the series of first electrical pulses. By sending the second electrical pulse after the volatile memory element 20 returns to a rested state, the non-volatile memristive element 30 may undergo a similar change in state (in an opposite direction) that occurred during the first electrical pulse.

Figure 3D:
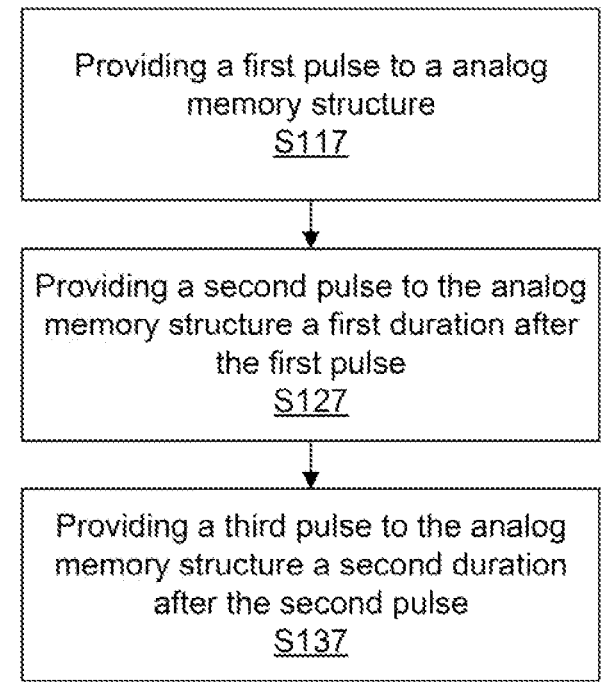

Referring to FIG. 3D, a method of using the analog memory structure of FIG. 1A and FIG. 2 during convergence to a weight value of the non-volatile memristive element 30. In step S117, a first electrical pulse is applied to the analog memory structure. The characteristics of the electrical pulse may be based on the characteristics of a write pulse for the type of non-volatile memristive element 30 used in the analog memory structure. For example, the electrical pulse may be 1 to 10 V, 1 to 50 ns for write pulses, and 0.05V to 1 V, 10 to 100 ns for read pulses, although voltage and duration may fall outside these ranges based on the type of non-volatile memristive element 30 that is selected.

In step S127, a second electrical pulse is applied to the analog memory structure a first duration after the first pulse. The characteristics of the electrical pulse may be based on the characteristics of a write pulse for the type of non-volatile memristive element 30 used in the analog memory structure. For example, the electrical pulse may be 1 to 10 V, 1 to 50 ns for write pulses, and 0.05V to 1 V, 10 to 100 ns for read pulses, although voltage and duration may fall outside these ranges based on the type of non-volatile memristive element 30 that is selected. The first duration may be, for example, 1 ns between the first pulse and the second pulse.

In step S137, a third electrical pulse is applied to the analog memory structure a second duration after the second pulse. The characteristics of the electrical pulse may be based on the characteristics of a write pulse for the type of non-volatile memristive element 30 used in the analog memory structure. For example, the electrical pulse may be 1 to 10 V, 1 to 50 ns for write pulses, and 0.05V to 1 V, 10 to 100 ns for read pulses, although voltage and duration may fall outside these ranges based on the type of non-volatile memristive element 30 that is selected. The second duration may be, for example, 2 ns between the first pulse and the second pulse. This duration may be longer than the first duration, but shorter than the relaxation time of the volatile memory element 20.

Referring to the methods in FIG. 3A-3D, each are example methodologies that may be accomplished alone, or in combination with each other, during a write process.

Referring to FIG. 4A-4B, FIG. 5A-5B, FIG. 6A-6B, and FIG. 7A-7B, example embodiments of the volatile memory element included with a non-volatile memristive device are depicted. The following non-exhaustive examples are instructive as to how the volatile memory element may be introduced into typical geometries for existing non-volatile memristive devices, but those of ordinary skill in the art would understand how to apply such concepts to other structures. Additionally, such non-volatile memristive devices may be used as part of a cross-point array, powered using a transistor, or any other arrangement of analog memory cells.

Referring to FIG. 4A and FIG. 4B example embodiments of a bi-directional analog memory structures are depicted as used in a resistive random-access memory (RRAM), however the concepts shown in the illustrative RRAM embodiments are understood to apply to all bi-directional analog memory structures. structures having a volatile memory element 320 are depicted. The RRAM device contains a conductive element 331 and a dielectric switching layer 330. The RRAM structure depicted has a bottom contact 310 and a top contact 340, located between an isolation dielectric 300. The RRAM device may either have the volatile memory element 320 between the bottom contact 310 and the dielectric switching layer 330 as depicted in FIG. 4A, or have the volatile memory element 320 between the top contact 340 and the conductive element 331, as depicted in FIG. 4B volatile memory element. Volatile memory element 320 may include metal layers, similar to what is depicted in FIG. 2, but must at least include a volatile memory layer.

Referring to FIG. 5A and FIG. 5B, bi-directional analog memory structures are depicted as used in a electro-chemical random-access memory (ECRAM), however the concepts shown in the illustrative ECRAM embodiments are understood to apply to all bi-directional analog memory structures. Additionally, FIG. 5B is shown to illustrate use of the volatile memory element in a symmetric device. The ECRAM structure contains an ion gate material 431 sandwiched by a first ion reservoir 430 and a second ion reservoir 432. The first ion reservoir 430 and the second ion reservoir 432 may be made of the same chemical composition, different chemical compositions, or of materials having similar chemical compositions with differing concentrations of ions or dopants. The ECRAM structure depicted has a bottom contact 410 and a top contact 440, located between an isolation dielectric 400. The ECRAM structure may either have the volatile memory element 420 between an ion reservoir 430/432 and a contact, such as between the first ion reservoir 430 and the bottom contact 410 as depicted in FIG. 5A. Additionally, the volatile memory element 420 may be between the first ion reservoir 430 and the second ion reservoir 432 and their respective contact as depicted in FIG. 5B, thereby forming a symmetric structure. Volatile memory element 420 may include metal layers, similar to what is depicted in FIG. 2, but must at least include a volatile memory layer.

Figure 6A:
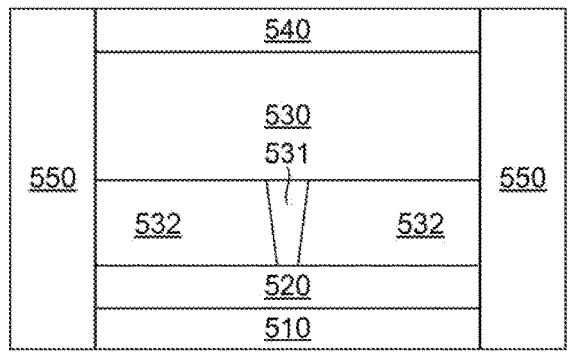
FIG. 6A and FIG. 6B depict a volatile memory element in series with an mushroom PCM device.
Figure 6B:
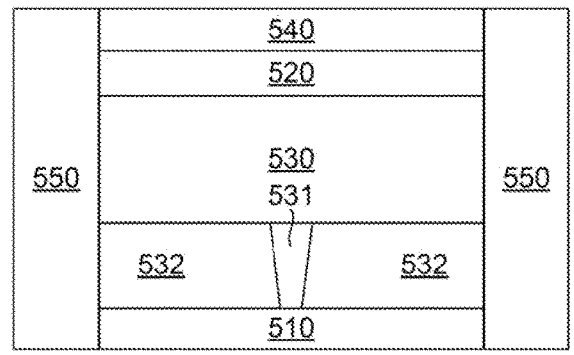

Referring to FIG. 6A and FIG. 6B example embodiments of a uni-directional analog memory structures are depicted as used in a mushroom PCM structure, however the concepts shown in the illustrative mushroom PCM embodiments are understood to apply to all uni-directional analog memory structures. The mushroom PCM device contains a heating element 531 and a dielectric layer 532 located beneath the phase change material 530. The mushroom PCM structure depicted has a bottom contact 510 and a top contact 540, located between an isolation dielectric 550. The mushroom PCM device may either have the volatile memory element 520 between the bottom contact 510 and the heating element 531, as depicted in FIG. 6A, or alternatively have the volatile memory element 520 between the top contact 540 and the phase change material 530, as depicted in FIG. 6B. Volatile memory element 520 may include metal layers, similar to what is depicted in FIG. 2, but must at least include a volatile memory layer.

Figure 7A:
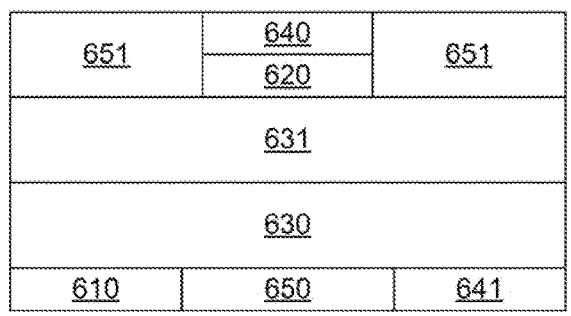
FIG. 7A and FIG. 7B depict a volatile memory element in series with an three-terminal ECRAM device.
Figure 7B:
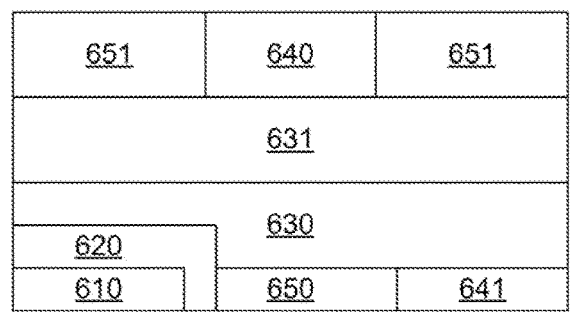

Referring to FIG. 7A and FIG. 7B, example embodiments of three terminal analog memory structures are depicted as used in a electrochemical random-access memory (ECRAM) structures having a volatile memory element are depicted, however the concepts shown in the illustrative three terminal ECRAM are understood to apply to all three terminal analog memory structures. The ECRAM structure depicted has a drain contact 610, a read contact 641, and a write contact 640 located between an isolation dielectric 650, 651. The ECRAM structure may have an electrolyte layer 631 and a channel 630. In such an embodiment where the read path (i.e., current flow from read contact 641 to drain contact 610) and the write path (i.e., current flow from write contact 640 to drain contact 610) are different, volatile memory element 620 would at least be located in the write path. For Example, as depicted in FIG. 7A, volatile memory element 620 may be located between the write contact 640 and the electrolyte layer 631 and thus only in the write path. Alternatively, as depicted in FIG. 7B, the volatile memory element 620 may be located on the drain contact 611, and thus in the read and the write path. Volatile memory element 620 may include metal layers, similar to what is depicted in FIG. 2, but must at least include a volatile memory layer.

Formation of the volatile memory element as part of the overall formation process for each non-volatile memristive device structure may be accomplished by depositing the volatile memory element in the applicable location (e.g., prior to deposition of the non-volatile memristive device layers as depicted in FIG. 5A, after the non-volatile memristive device layers as depicted in FIG. 5B) prior to patterning the structure and forming contacts. Deposition of the volatile memory element may be accomplished by PVD deposition such as pulsed laser deposition, sputter deposition, chemical vapor deposition, MOCVD, solution deposition, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A structure comprising:
a three contact analog memory structure comprising a volatile memory element in series with a non-volatile memory element, wherein the three contact analog memory structure comprises a drain contact, a read contact, and a write contact, wherein current flow along a write path of the three contact analog memory structure is different from current flow along a read path of the three contact analog memory structure.

2. The structure of claim 1, wherein the non-volatile memory element comprises a memristive device.

3. The structure of claim 1, wherein the volatile memory element comprises a material that temporarily changes its resistance when subjected to an electrical field across the material.

4. The structure of claim 1, wherein the volatile memory element comprises a material which becomes more conductive upon application of an electric potential across the material and returns to a relaxed state once the electrical field induced by electric potential is removed.

5. The structure of claim 1, wherein the volatile memory element comprises a volatile memory layer located between a first conductive layer and a second conductive layer.

6. The structure of claim 1, wherein the volatile memory element comprises a volatile memory layer, and wherein a material for the volatile memory layer comprises an MIT-MIEC material.

7. The structure of claim 1, wherein the volatile memory element comprises a volatile memory layer, and wherein a material for the volatile memory layer is selected from the group consisting of: $XCoO_2$, $XNbO_2$, $XVO_2$, $XNbO_3$, $X_{4x}Ti_5O_{12}$, and/or $XSmNiO_3$, wherein X is an alkali metal.

8. The structure of claim 2, wherein the non-volatile memory element comprises a bi-directional non-volatile memory.

9. The structure of claim 2, wherein the non-volatile memory element comprises a uni-directional non-volatile memory.

10. The structure of claim 2, wherein the non-volatile memory element comprises a resistive random-access memory (RRAM).

11. The structure of claim 2, wherein the non-volatile memory element comprises a conductive bridging random-access memory (CBRAM).

12. The structure of claim 2, wherein the non-volatile memory element comprises a electrochemical random-access memory (ECRAM).

13. The structure of claim 2, wherein the non-volatile memory element comprises a phase change memory (PCM).

14. A memory structure comprising:
a three terminal memory structure comprising a volatile memory element in series with a non-volatile memory element, wherein the three terminal memory structure comprises different terminals for a read path and a write path, and wherein the volatile memory element is located in the write path of the three terminal memory structure.

15. The structure of claim 14, wherein the volatile memory layer comprises a material that temporarily changes its resistance when subjected to electrical potential across the material.

16. The structure of claim 14, wherein the volatile memory element comprises a material which becomes more conductive upon application of an electric potential across the material and returns to a relaxed state once the electric potential is removed.

17. The structure of claim 14, wherein the volatile memory element comprises a volatile memory layer located between a first conductive layer and a second conductive layer.

18. The structure of claim 14, wherein a material for the volatile memory layer is selected from the group consisting of: $XCoO_2$, $XNbO_2$, $XVO_2$, $XNbO_3$, $X_{4x}Ti_5O_{12}$, and/or $XSmNiO_3$, wherein X is an alkali metal.

19. A method of writing to a memory structure comprising:
applying a first pulse to an analog memory structure, wherein the analog memory structure comprises a volatile memory element and a non-volatile memristive element in series; and
applying a second pulse to the analog memory structure, wherein a time between the first pulse and the second pulse is less than a relaxation rate of the volatile memory element.

20. The method of claim 19 further comprising applying a third pulse to the analog memory structure, wherein the time between the second pulse and the third pulse is substantially similar to the time between the first pulse and the second pulse.

21. A method of writing to a memory structure comprising:
applying a first pulse to an analog memory structure, wherein the analog memory structure comprises a volatile memory element and a non-volatile memristive element in series;
applying a second pulse to the analog memory structure, and wherein a first time between the first pulse and the second pulse is less than a relaxation rate of the volatile memory element; and
applying a third negative pulse to the analog memory structure, wherein a second time between the second pulse and the third negative pulse is less than the relaxation rate of the volatile memory element and more than the first time.

22. The method of claim 21 further comprising:
prior to the first pulse, applying a plurality of pulses to the analog memory structure, wherein each pulse is substantially similar, and wherein a duration between pulses is substantially similar.

23. A method of writing to an analog memory structure comprising:
applying a first pulse to an analog memory structure, wherein the analog memory structure comprises a volatile memory element and a non-volatile memristive element in series;
applying a second pulse to the analog memory structure, and wherein a first time between the first pulse and the second pulse is less than a relaxation rate of the volatile memory element; and
applying a third pulse to the analog memory structure, wherein a second time between the second pulse and the third pulse is less than the relaxation rate of the volatile memory element and more than the first time.

24. The method of claim 23 further comprising:
prior to the first pulse, applying a plurality of pulses to the analog memory structure, wherein each pulse is substantially similar, and wherein a duration between pulses is substantially similar.

25. The structure of claim 1, wherein the read path involves current flow from the read contact to the drain contact, and wherein the write path involves current flow from the write contact to the drain contact.

* * * * *